US011995058B2

(12) United States Patent
Ritter et al.

(10) Patent No.: US 11,995,058 B2
(45) Date of Patent: May 28, 2024

(54) COMPRESSION SERVICE USING FPGA COMPRESSION

(71) Applicant: SAP SE, Walldorf (DE)

(72) Inventors: Daniel Ritter, Heidelberg (DE); Andre Dossinger, Waghaeusel (DE); Kai Mueller, Karlsruhe (DE); Norman May, Karlsruhe (DE)

(73) Assignee: SAP SE, Walldorf (DE)

( * ) Notice: Subject to any disclaimer, the term of this patent is extended or adjusted under 35 U.S.C. 154(b) by 0 days.

(21) Appl. No.: 17/857,831

(22) Filed: Jul. 5, 2022

(65) Prior Publication Data
US 2024/0012799 A1    Jan. 11, 2024

(51) Int. Cl.
*G06F 16/22*    (2019.01)
*H03M 7/40*    (2006.01)

(52) U.S. Cl.
CPC .......... *G06F 16/221* (2019.01); *H03M 7/40* (2013.01)

(58) Field of Classification Search
CPC ................................................. G06F 16/221
USPC ........................................................ 707/803
See application file for complete search history.

(56) References Cited

U.S. PATENT DOCUMENTS

| 2009/0022413 | A1* | 1/2009 | Singh | ............ H04L 69/04 382/244 |
| 2010/0325094 | A1* | 12/2010 | Yang | ............ G06F 16/22 707/693 |
| 2015/0178305 | A1* | 6/2015 | Mueller | ............ G06F 16/17 707/693 |
| 2016/0098420 | A1* | 4/2016 | Dickie | ............ G06F 16/2365 707/693 |
| 2017/0278208 | A1* | 9/2017 | Oni | ............ G06Q 10/10 |

FOREIGN PATENT DOCUMENTS

| CN | 108322220 A | * | 7/2018 | ........ H03M 7/3086 |
| CN | 110427258 A | * | 11/2019 | ........ G06F 9/4806 |
| CN | 115168319 A | * | 10/2022 | |

* cited by examiner

*Primary Examiner* — Syling Yen
(74) *Attorney, Agent, or Firm* — Mintz Levin Cohn Ferris Glovsky and Popeo, P.C.

(57) ABSTRACT

A method, a system, and a computer program product for providing a compression service, such as a Compression as a Service (Caas). In some implementations, there is provided a method including receiving, at a compression service, metric information regarding one or more columns of a database server; in response to receiving the metric information, processing, by the compression service, the metric information to identify at least one column as a candidate for compression by the compression service; in response to identifying the at least one column, compressing by the compression service, the at least one column, wherein the compression service uses a hardware accelerator to execution a compression algorithm that compresses the at least one column; and notifying, by the compression service, the database server of the at least one column compressed by the compression service. Related systems, methods, and articles of manufacture are also disclosed.

15 Claims, 9 Drawing Sheets

Table Column 105

Delta 162

Main 164

| Text | | Grammar | Text after pair replacement |
|---|---|---|---|
| 1. | tobeornottobeortobeornot | 0→to | 0beornot0beor0beornot |
| 2. | 0beornot0beor0beornot | 1→0b | 1eornot1eor1eornot |
| 3. | 1eornot1eor1eornot | 2→1e | 2ornot2or2ornot |
| 4. | 2ornot2or2ornot | 3→2o | 3rnot3r3rnot |
| 5. | 3rnot3r3rnot | 4→3r | 4not44not |
| 6. | 4notE4not | 5→4n | 5ot45ot |
| 7. | 5otE5ot | 6→5o | 6t46t |
| 8. | 6tE6t | 7→6t | 747 |

COMPRESSION SERVICE USING FPGA COMPRESSION

TECHNICAL FIELD

This disclosure relates generally to data processing and, in particular, a database management system including compression provided by a separate hardware-based compression service.

BACKGROUND

Database management systems have become an integral part of many computer systems. For example, some systems handle hundreds if not thousands of transactions per second. On the other hand, some systems perform very complex multidimensional analysis on data. In both cases, the underlying database may need to handle responses to queries very quickly in order to satisfy systems requirements with respect to transaction time. Given the complexity of these queries and/or their volume, the underlying databases face challenges in order to optimize performance.

SUMMARY

In some implementations, there is provided a method including receiving, at a compression service, metric information regarding one or more columns of a database server; in response to receiving the metric information, processing, by the compression service, the metric information to identify at least one column as a candidate for compression by the compression service; in response to identifying the at least one column, compressing by the compression service, the at least one column, wherein the compression service uses a hardware accelerator to execution a compression algorithm that compresses the at least one column; and notifying, by the compression service, the database server of the at least one column compressed by the compression service.

In some variations, one or more of the features disclosed herein including the following features can optionally be included in any feasible combination. The compression service comprises a hardware data processor providing hardware acceleration for the compressing provided by the compression service. The hardware data processor comprises one or more of the following: at least one field programmable gate array (FPGA), at least one graphics processing unit, and at least one tensor processing unit. The compression service comprises a compression as a service provided by a platform as a service provider. The service provider that provides the compression service is the same platform as the service provider that provides the database server. The same datacenter of the platform as the service provider provides the compression service and the database server. Different datacenters of the platform as the service provider provide the compression service and the database server. The platform as the service provider that provides the compression service is a different platform as the service provider that provides the database server. The database server comprises an in-memory, column store database. The metric information includes one or more of the following: a size of the at least one column in bytes, an access frequency of the size of the at least one column, an access frequency threshold, and a size threshold. The processing further includes identifying the at least one column in response to a size of the at least one column exceeding a size threshold. The processing further comprises processing at least one other column, and in response to a corresponding size of the at least one other column being less than the size threshold, the at least one other column is not identified for compression by the compression service. The hardware accelerator comprises a floating point gate array providing a recursive pairing compression algorithm. The notifying further comprises the compression service providing a list of the compressed at least one table and/or providing the compressed at least one column.

Non-transitory computer program products (i.e., physically embodied computer program products) are also described that store instructions, which when executed by one or more data processors of one or more computing systems, causes at least one data processor to perform operations herein. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including but not limited to a connection over a network (e.g., the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

FIG. 3B depicts an example of a delta fragment of a column store database and a main fragment of the column store database, in accordance with some embodiments;

FIG. 3C depicts an example of the Re-Pair compression, in accordance with some embodiments;

DETAILED DESCRIPTION

In systems such as an in-memory database, memory is a valuable resource, so making optimal use of memory resources at an in-memory database is an aspect of its operation. Compression is a way to optimize memory resources, for example. Specifically, compression can be used to compress data and thus save the memory footprint used by that data. However, the resources to compress the data take time and processing resources. In an in-memory database time is also a valuable resource in the sense that queries should be processed quickly, so the benefit of compressing data should take into account the cost of the compression in terms of time (or processing resources). In some embodiments, there is disclosed an independent data processing service such as a compression service or compression as a service (CaaS) hosted at a platform as a service (PaaS) provider. In some embodiments, the CaaS service employs a hardware accelerator, such as a field programmable gate array (FPGA), graphics processing unit (GPU), Tensor Processing Unit (TPU), and/or other type of accelerator for performing data processing, such as compression in case of CaaS. In the case of the CaaS, the CaaS allows the database management system to offload the compression to the CaaS. The use of CaaS represents an example data processor, which may consists of software and hardware components, in which the hardware component either helps to offload work from a CPU-based software processor or accelerates over such processor.

Figure 1A:
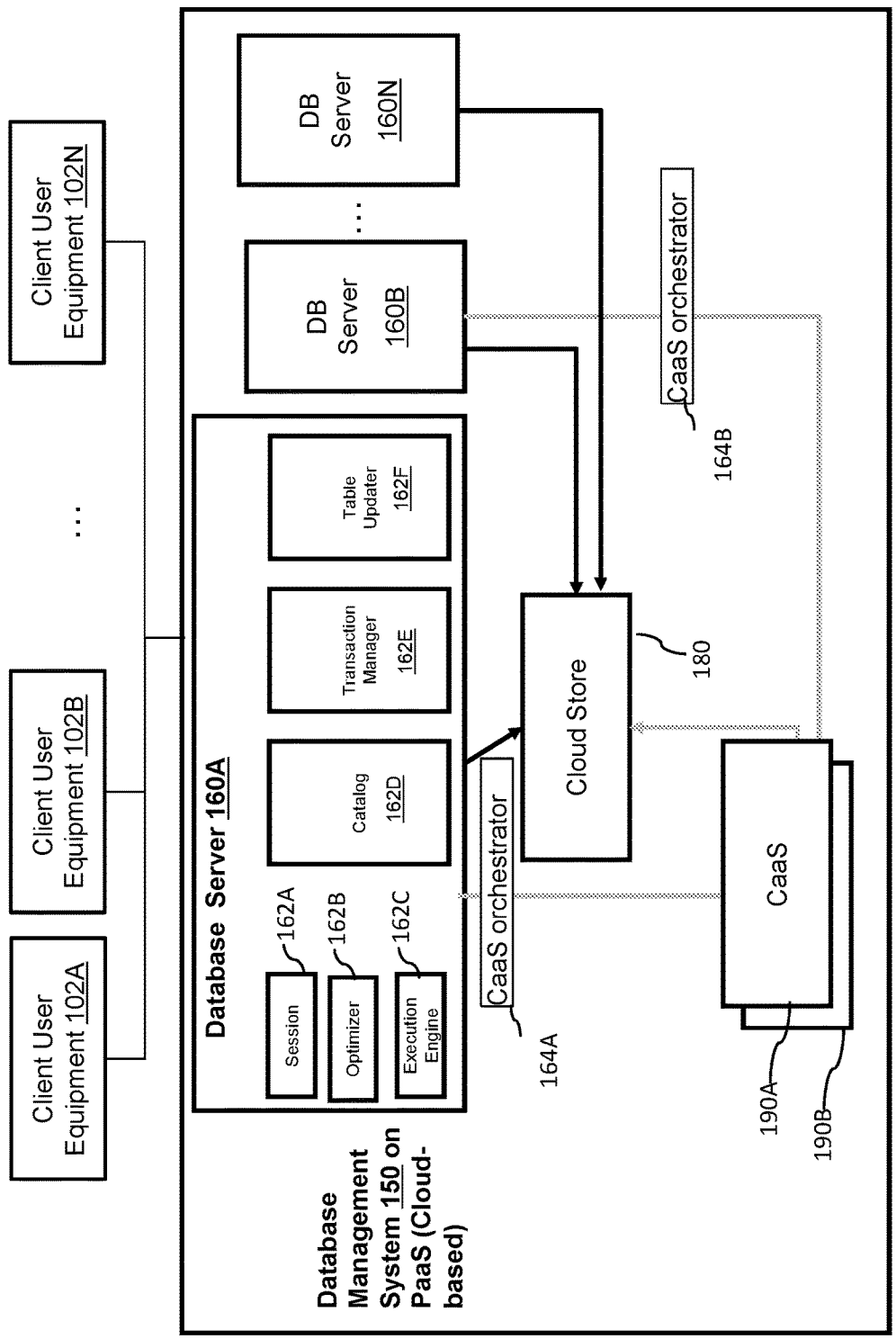
FIG. 1A depicts an example of a system, in accordance with some embodiments.

FIG. 1A depicts an example of a system 100, in accordance with some example implementations. The example of FIG. 1A depicts one or more user equipment (labeled client user equipment) 102A-N. The user equipment may comprise or be comprised in a computer, a smart phone, a tablet, an Internet of Things (IoT) device, and/or other type of computer device or processor-based device. The user equipment may also include a user interface, such as a browser or other application to enable access to one or more applications, database layer(s), and/or databases, to enable sending queries and receiving responses to those queries from one or more database management systems.

In the example of FIG. 1A, the user equipment 102A-N may access at least one database management system, such as a database management system 150 hosted on a cloud based hardware platform, such as a platform as a service (PaaS). An example of a PaaS provider is Amazon Web Services, although this is merely an example to illustrate the concept of a PaaS provider. The PaaS may provide a host server configured to provide a database server 160A, while other host servers at the PaaS may provide a database server 160B, and so forth through database server 160N. To illustrate further, the PaaS provider may provide resources that can be shared among a plurality of client devices. For example, the cloud PaaS provider may be configured to provide a variety of additional services including, for example, software-as-a-service (SaaS), infrastructure as a service (IaaS), database as a service (DaaS), as well as the noted PaaS. And these services can be accessed by one or more client devices. The PaaS provider may, as noted, include resources, such as at least one computer (e.g., a server), data storage, and a network (including network equipment) that couples the computer(s) and storage. The host platforms at the PaaS may provide (or, e.g., include) other resources, such as operating systems, hypervisors, and/or other resources, to virtualize physical resources (e.g., via virtual machines), provide deployment (e.g., via containers) of applications, and other resources. In the PaaS may be consider a "public" cloud platform, at which services may be provided on-demand to a client via the Internet. For example, the resources at the public cloud platform may be operated and/or owned by a cloud service provider (e.g., Amazon Web Services, Azure, etc.), such that the physical resources at the cloud service provider can be shared by a plurality of clients. Alternatively, or additionally, the PaaS may be consider a "private" cloud platform, in which case the resources of the cloud platform may be hosted on an entity's own private servers (e.g., dedicated corporate servers operated and/or owned by the entity). Alternatively, or additionally, the PaaS may be considered a "hybrid" cloud platform, which includes a combination of on-premises resources as well as resources hosted by a public or private cloud platform. For example, a hybrid cloud service may include web servers running in a public cloud while application servers and/or databases are hosted on premise (e.g., at an area controlled or operated by the entity, such as a corporate entity).

In the example of FIG. 1A, the database server 160A comprises an in-memory database, an example of which is SAP's HANA database (although other types of databases may be used as well). Alternatively, or additionally, the database server 160A may comprise a column store database. The phrase "in-memory database" refers to a database management system in which main memory provides the primary computer data storage for transaction data used to respond to queries for example, such that most if not all of the data typically used for transactions can be kept in main memory, rather than persisted to a slower type of storage such as disk based storage. The use of the in-memory database provides faster queries, when compared to more disk base storage solutions. The column store database (or column store database management system) refers to a database management system that indexes the data of the columns of a database table, such that the column indexes are stored rather than storing row data. In a column store database (also referred to as a column-oriented database), the values in the column may be compressed using a dictionary, such that the values of a column index can be decoded into the original data using the dictionary. As the values in a column may be of a similar type (e.g., a column of cites, a column of countries, a column of amounts), the use of the dictionary can provide some compression, when compared to row-oriented database where the values in a row can be dissimilar.

Figure 1B:
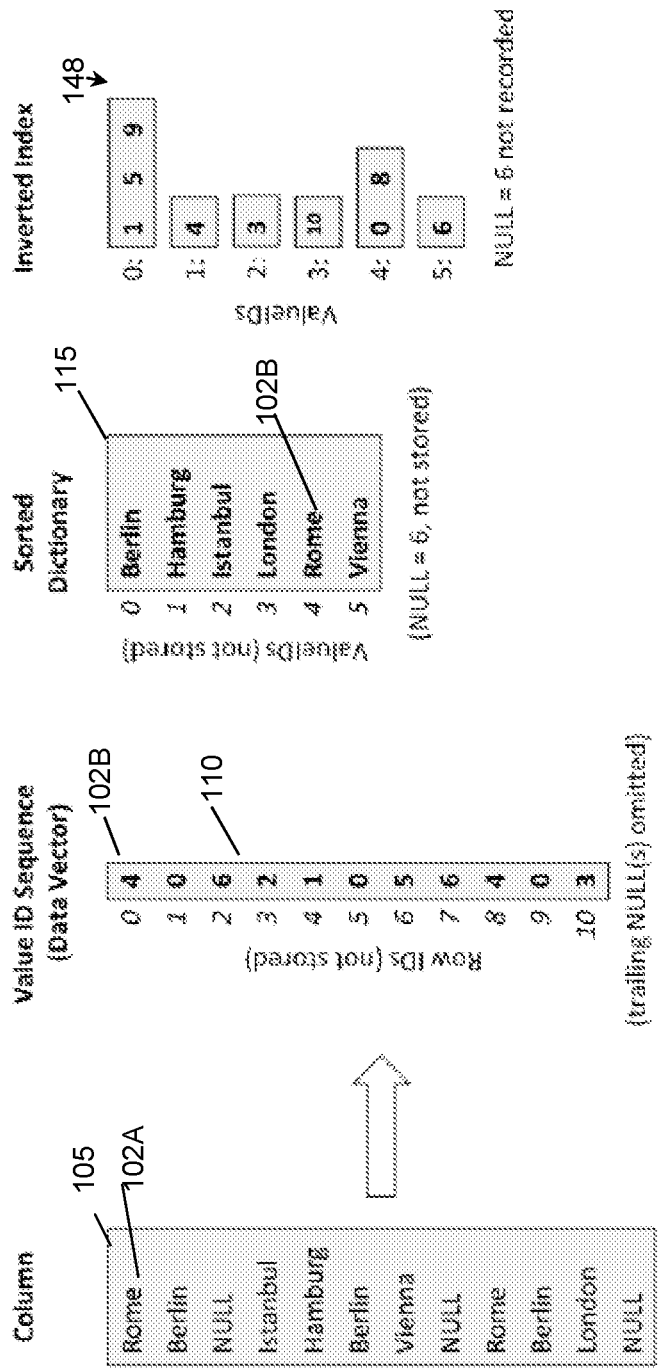
FIG. 1B depicts an example of a columnar storage layout employed in a column store database, in accordance with some embodiments.

FIG. 1B depicts an example of the columnar, value-ID-based storage layout employed in a column store database. The data vector 110 represents the values 105 encoded using the dictionary 115 and then stored in the column store database. For example, the value "Rome" 102A is encoded using the dictionary value ID "4" 102B. The other values, such as Berlin, NULL, Istanbul, Hamburg, etc. are also encoded using the dictionary 115. The column 105 can thus be stored in an encoded form (e.g., encoded based on dictionary 115) as the data vector 110. In the example of FIG. 1B, NULL values are encoded using the dictionary 115 but may not be stored, although they can be stored as well. The inverted index 148 may be used to map each value ID of the data vector to a list of row IDs (which represent row positions) in the data vector 110 that contain the value ID.

As the database server 160A is implemented at the PaaS provider, there can be provided a plurality of database servers 160B-N to provide services to the same or different client user equipment. The quantity of database servers 160A-N may be scaled up (e.g., increased) or scaled down (e.g., reduced) for a variety of reasons, such as increase or decrease in demand.

Referring again to FIG. 1A, the database server 160A may include one or more components, such as a session manager 162A, an optimizer 162B, an execution engine 162C, a catalog 162D, a transaction manager 162E, and a table updater 162F.

The session manager 162A handles the tracking of sessions associated with each of the client user equipment 102A-N (e.g., by tracking a session associated with a request such as a query from a client). The optimizer 162B provides a query optimizer for a database query provided by a client user equipment. The execution engine 162C is a query execution engine that handles execution of the database query (or query for short). The catalog 162D maintains metadata for the database server 160 (e.g., metadata regarding tables, users, and the like). The transaction manager 162E is responsible atomicity, consistency, isolation, durability (ACID) for transactions in the multi-user system. The table updater 162F is responsible for data manipulation in the database, such as inserting data into a table, deleting data into a table, updating data into a table, and the like.

In the example of FIG. 1A, the database server 160A persists its data at a store, which is labeled as cloud store 180. For example, the database server 160A may include most if not all of the transaction data in memory at the database server 160A, but may persist from time to time some of the data to the cloud store. The cloud store may be an in-memory cloud store. Alternatively, or additionally, the cloud store may include other types of storage as well. In some implementations, data is persistently stored in the cloud store and made available to the in-memory database as kind of ephemeral storage. The CaaS as an example of a data processing service does not only require the table data read-only for processing, but will change the data, requiring write access to the data store. The newly compressed data will then be made available to the in-memory component. In a way, the in-memory component could be a data processor similar to CaaS.

In some embodiments, the system 100 also includes compression as a service (CaaS) 190A. In some embodiments, the CaaS may provide compression to data being used by one or more database servers. For example, a table (or a column) may be identified for compression by the CaaS. When that is the case, the CaaS compresses the table (or column) of data to enable savings in memory size (and thus usage) of the database server 160A. As noted, the data may be user data or may be an index as described above with respect to vector 110 at FIG. 1B. In the case of a column store database, the column may correspond to an index (also referred to a data vector) as noted above with respect to 110 above.

In some embodiments, the CaaS 190A includes a hardware accelerator that performs the compression of the data of the column. In some embodiments, the hardware accelerator is FPGA circuitry (or other type of hardware accelerator). In some embodiments, a single CaaS 190A may be shared among a plurality of database servers 160A-N. Moreover, the quantity of the CaaSs may be scaled up (added) or scaled down (removed) as shown at FIG. 1, such that the scaling is based on demand for the compression. Based on demand for example, a group of CaaSs 190A-B may be designated to serve database servers 190A-N. Alternatively, or additionally, a given CaaS, such as CaaS 190B, may be designated to serve a specific database server (or servers).

The system 100 may also include CaaS orchestrators 164A-B. The CaaS orchestrators may be used to interface with the CaaS. Alternatively, or additionally, the CaaS orchestrators may be used to trigger the CaaS to identify one or more candidate columns for compression and/or trigger the CaaS to compress the identified columns. The orchestrator provides an intelligent component that decides when a certain action is conducted and by whom. In case of CaaS, the orchestrator looks into table metrics of the cloud store, decides (or determines) a compression scheme, selects the hardware accelerator's data processor, schedules the work, and/or consumes the result afterward the compression to decide on further actions and assess the quality of the result (e.g., performance improvement and the like).

Figure 2:
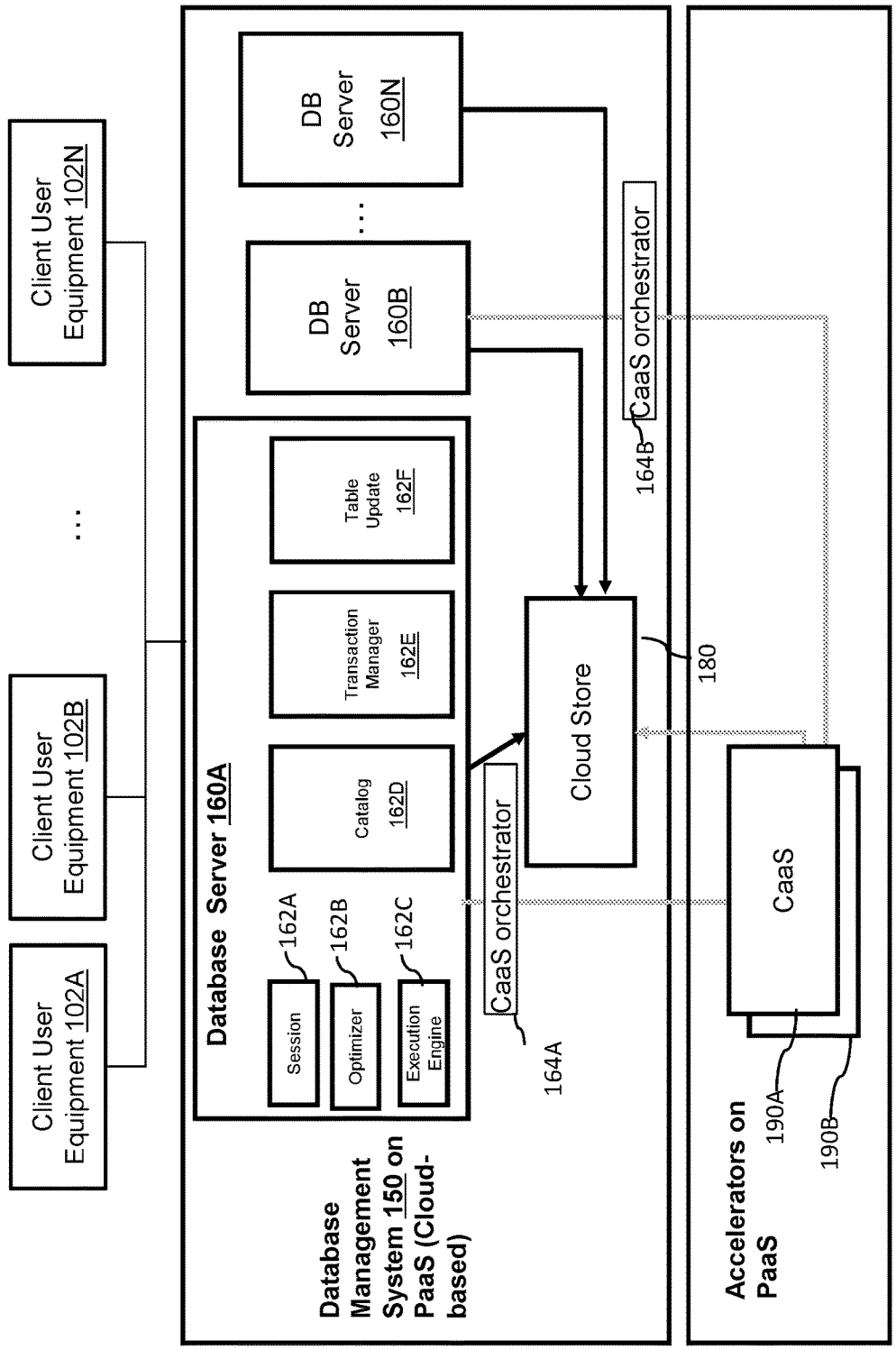
FIG. 2 depicts another example of a system, in accordance with some embodiments.

In the example of system 100 at FIG. 1A, the database server 160A, cloud store 180, and CaaS 190A are all implemented on the same virtual network of a datacenter at a given PaaS. When implemented at a single datacenter of a PaaS provider, the system implementation may be simplified with respect to communications and other issues associated with cross data center and cross PaaS implementations. Nonetheless, the database server 160A, cloud store 180, and CaaS 190A may be implemented in a cross data center (i.e., different data centers of the same PaaS provider) or cross PaaS providers (different PaaS providers). FIG. 2 depicts the system 200 that is similar to system 1 of FIG. 1 in some respects but the system 200 implements the CaaS at a different data center of the same PaaS (e.g., another Amazon Web Service datacenter) or using a different PaaS provider (e.g., another web service provider) when compared to the database management system 160A.

Figure 3A:
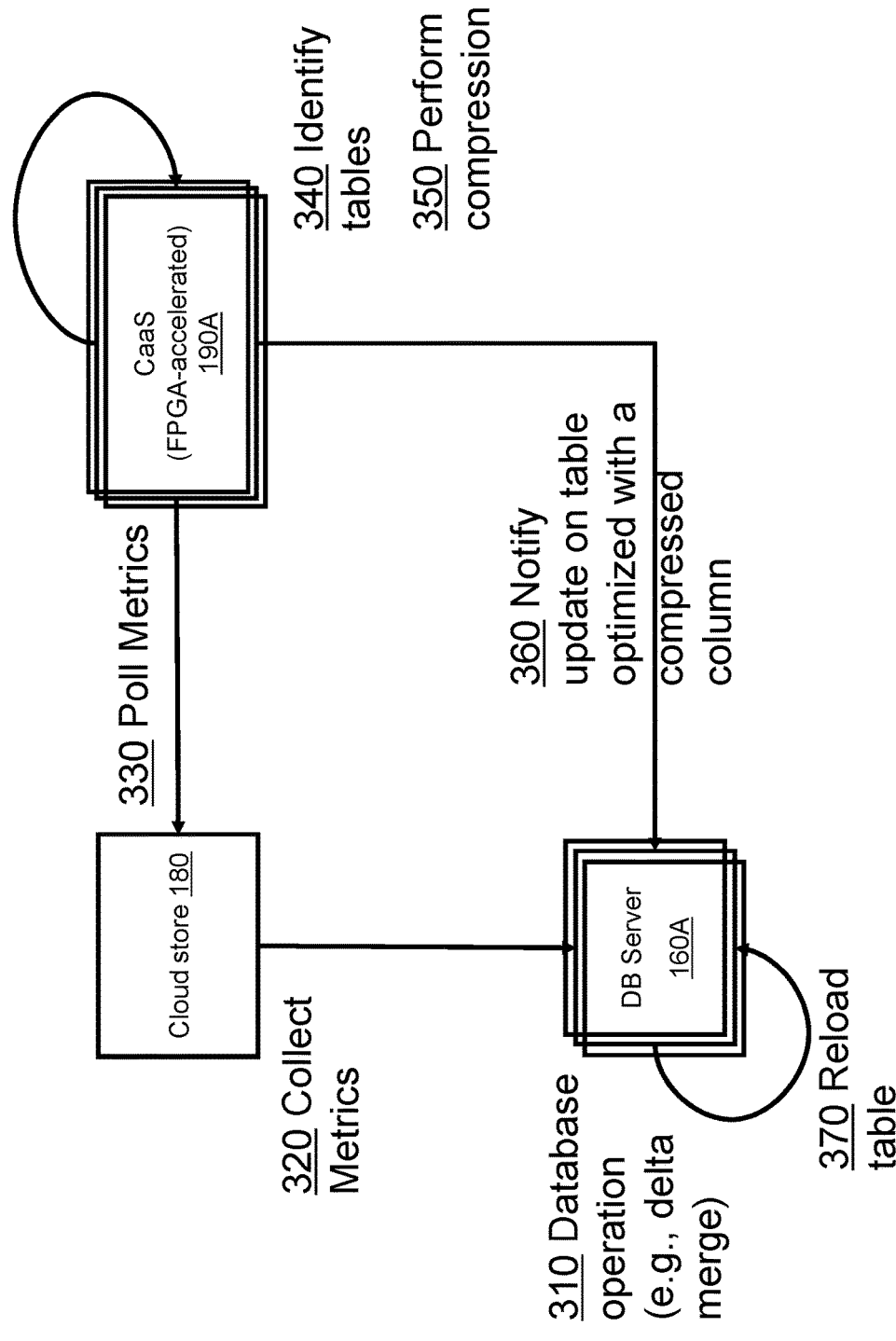
FIG. 3A depicts a block diagram and a process flow, in accordance with some embodiments.

FIG. 3A depicts a block diagram that also includes a process flow, in accordance with some embodiment. FIG. 3A depicts the database server 160A, the cloud store 180, and the CaaS 190A (which implements a hardware accelerator, such as an FPGA).

At 310, database operations may be performed that operate on one or more database tables (or columns of the database tables). For example, the database server 160A may perform a delta merge. The delta merge refers to a merge that moves data (corresponding to changes) to a read-optimized main storage of the database server 160A. The change data may be stored in one or more database tables (or column) and moved to one or more other database tables (or column) in the main storage. In some embodiments, the database operation may trigger the collection of metrics at 320, the polling of metrics 330, and/or the identification and compression of certain tables or columns 340-350.

Although the example of FIG. 3A depicts the operation as a delta merge, other database operations may occur at 310 as well. These operations require access to table (or columns) in database server 160A. As such, compression using the CaaS may provide saving with respect to memory usage of the in-memory database.

Figure 3B:
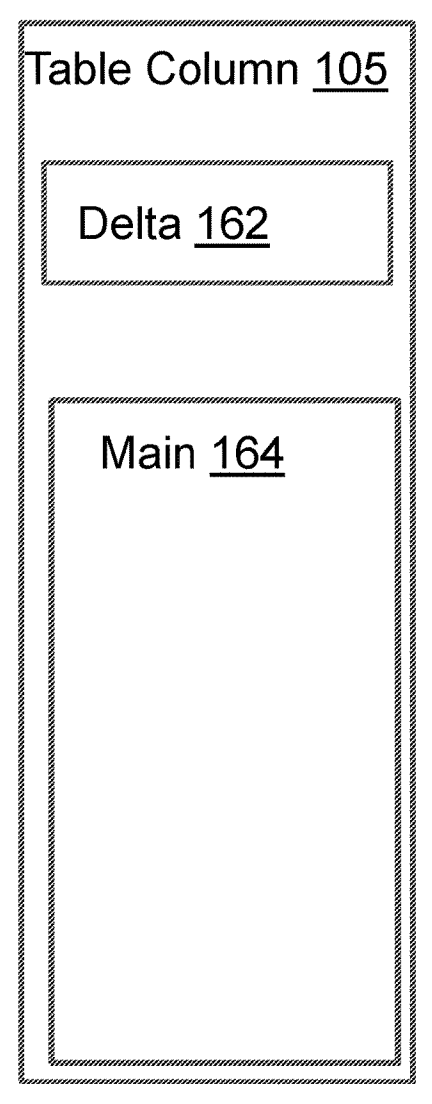

In the case of a column store database, it may include a read-optimized main fragment, which may be hold the majority of the data, and a small write-optimized delta fragment. When this is the case, values may be initially inserted (or updated) to the end of the delta fragment that is optimized for writing. However, a query may need to execute on both the main fragment and the delta fragment, in which case the corresponding results are merged as a delta merge. FIG. 3B depicts an example of a delta fragment 162 of a column store database and a main fragment 164 of the column store database, both of which are associated with a table column 105 (depicted in FIG. 1). The column store main fragment 164 may include most if not all of the data of the column 105 (or, if partitioned, of that columnar partition), and the delta fragment 162 contains newly-written data which has not yet been merged into the column store's main fragment 164. Although only a single column of a delta fragment and a main fragment are shown to simplify the explanation, the column store database may include additional fragments and columns.

Referring again to FIG. 3A, the cloud store 180 may gather, at 320, metrics on the database operations performed at 310 by the database server 160A. For example, the cloud store may collect metrics such as the length (e.g., size) of a table (or column of the database table) being accessed as part of the operation of 310. To illustrate further, a first database column (which contains a long string of values) would provide more memory space savings when compressed than a compressed second database column that does not contain as long a string of values, such that the benefit of the compression may be weighed against the processing cost of performing the compression. By way of an additional example, the cloud store may collect metrics such as the access frequency of a table (or column of the database table) being accessed as part of the operation of 310. For example, the access frequency may indicate how often over a given time period or session a table (or column) is accessed by the database server 160A. In this way, a table (or a column) that is rarely accessed may not be a good candidate for compression, when compared to a column that is access frequently. In some embodiments, the metrics collected at 320 may be processed to determine a size threshold (e.g., a length or a string length in bytes) of one or more tables (or columns) of the database server 160, such that a given column having a length (or string length) less than the size threshold are not compressed. In this way, the benefit of the compression with respect to memory saving is more likely to outweigh the processing cost of performing the compression.

In some embodiments, the column includes data representative of an index (or column index) as noted above with respect to vector 110. When this is the case, a first compression scheme may used when the size of column is less than the size threshold noted above. But when the size of column is more than (or equal to) the size threshold, a second compression may applied on the column. To illustrate by way of an example, if the size of a column is less than a size threshold of 3 bytes, no compression (or a light-weight compression such as prefix compression) is used on the column, but if the size of the column is more than or equal to a size threshold of 3 bytes, a Re-Pair compression algorithm is applied to the column by the hardware accelerator of the CaaS 190A. In the context of string dictionary compression, prefix compression refers to an encoding where for a sequence of a string, subsequent strings may share a common prefix. The first string of the block is stored uncompressed, and for subsequent strings, the length of the prefix shared with the predecessor is stored together with the suffix. The term "Re-Pair" refers to recursive pairing. Re-Pair is a grammar-based compressor that operates by recursively replacing high-frequency character pairs with new grammar symbols.

FIG. 3C depicts an example of Re-Pair compression applied to the Text "tobeornottobeortobeornot" (see line 1). When the grammar rule is applied, the text after pair replacement is "0beornot0beor0beornot." The "Grammar" rules are applied until the compression results in "747" (see line 8) as the Re-Pair compressed form of "tobeornottobeortobeornot."

Referring again to FIG. 3A, the CaaS 190A may obtain, at 330, one or more metrics collected by the cloud store 180. For example, the CaaS 190A may check with (e.g., poll) or request from the cloud store 180 metrics regarding one or more database tables (or columns) of the database server 160A. Alternatively, the cloud store 180 may push metrics for the one or more database tables (or columns) without an express request from the CaaS 190A). These metrics may include one or more of the following for each of the tables (or columns) of the database server 160A: size of the tables (or columns) in bytes, access frequency of the table (or columns), an access frequency threshold, a size threshold, and/or other metrics.

At 340, the CaaS 190A may identify one or more tables (or columns) for compression at the CaaS. For example, the CaaS may process the metric information obtained at 330 and then identify which tables (or columns) have a size that exceed a threshold size. Referring to the previous example, the CaaS may identify one or more tables (or columns) having a size greater than a size threshold, such as 3 Bytes for example, as candidates for compression by the CaaS.

Alternatively, or additionally, the CaaS 190A may also identify tables (or columns) based on frequency of access. For example, if the frequency of access (e.g., read, write, delete, or other operation) on a table (or column) is less than an access frequency threshold, the CaaS may determine that the column is not a good candidate for compression by the CaaS even if the column has a size that exceeds the size threshold. If the frequency of access on a table (or column) is greater than the access frequency threshold, the CaaS may determine that the table (or column) is a good candidate for compression by the CaaS given the column has a size that exceeds the size threshold.

At 350, the CaaS 190A may compress one or more tables (or columns) identified at 340. As noted, the CaaS 190A may include a hardware accelerator to provide quicker compression, when compared to a CPU-implemented compression. In some embodiments, the CaaS 190A may apply a grammar based compression scheme, such as Re-Pair compression to the table(s) (or column(s)) identified at 340.

To illustrate the compression 350 in operation, if a first column has a size exceeding a size threshold, the first column may be identified at 340 as a candidate for compression and then compressed at 350 by the compression hardware of the CaaS 190. In another example, if the first column has a size exceeding a size threshold and a frequency of access exceeding an access frequency threshold, the first column may be identified at 340 as a candidate for compression and then compressed at 350 by the compression hardware of the CaaS 190. In yet another example, if the first column has a size exceeding a size threshold and a frequency of access that does not exceed an access frequency threshold, the first column may not be identified at 340 as a candidate for compression and thus not compressed at 350 by the compression hardware of the CaaS 190. And, if the first column has a size that does not exceed a size threshold, the first column will not be identified at 340 as a candidate for compression and thus not compressed at 350 by the compression hardware of the CaaS 190. The CaaS may evaluate one or more of the tables (or columns) of the database server 160A in order to identify candidate tables (or columns) for compression and then compress the identified candidate tables (or columns).

Although some of the examples refer to the CaaS 190A providing Re-Pair compression, other types of compression may be performed by the CaaS 190A, Re-Pair compression may advantageously provide enhanced compression rates, when compared to other technologies.

At 360, the CaaS 190A may provide to the database server 160A a notification of the columns (or tables) that have been optimized with compression by the CaaS 190A. For example, the CaaS 190A may provide a list of the one or more columns (or tables) that have been compressed by the CaaS using for example Re-Pair compression. This enables the DB server 160A to reload the compressed column(s) (or table(s) into memory (saving thus memory). Alternatively, or additionally, the CaaS may provide at 360 the compressed table(s) (or column(s)). For example, the compressed table is streamed to the cloud store and updated if consistent. The in-memory part will be updated subsequently from the store as noted above.

At 370, the database server may reload the compressed table(s) (or column(s), in response to the notification that they have been compressed.

Although some of the examples refer to an in-memory and/or a column store database such as the HANA database, the CaaS 190A may be implemented in other types of databases as well.

Figure 4:
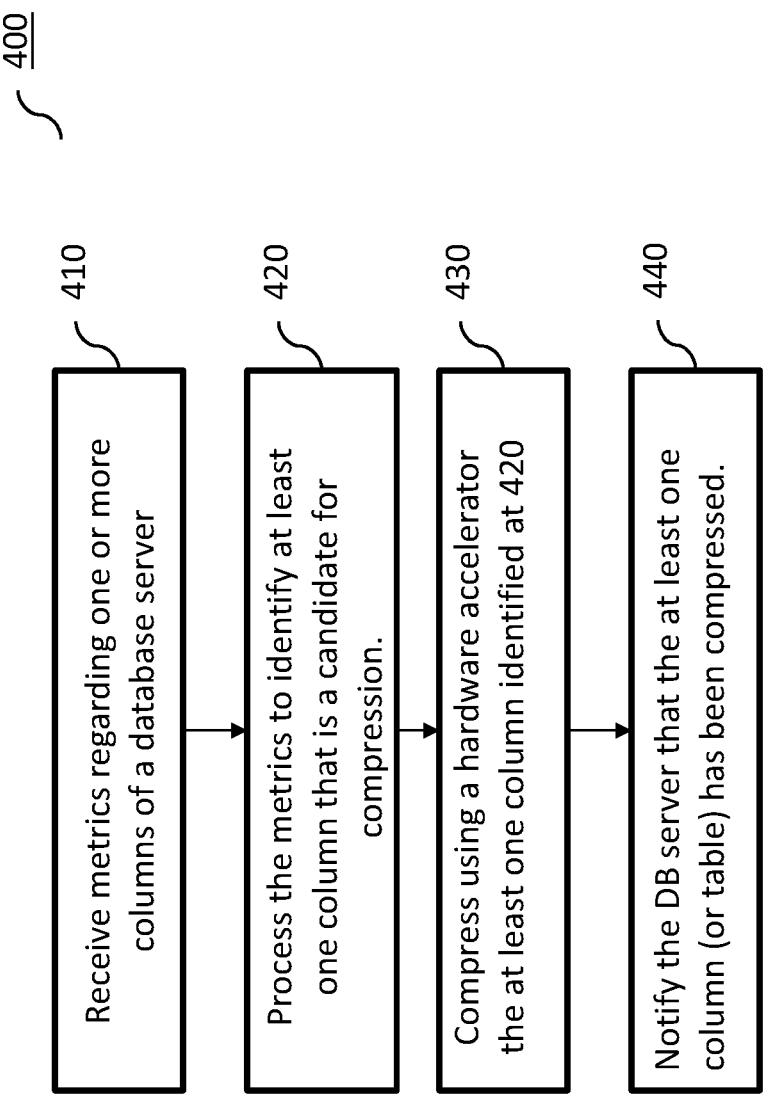
FIG. 4 depicts an example of a process flow, in accordance with some embodiments.

FIG. 4 depicts an example of a process flow 400, in accordance with some embodiments.

At 410, the CaaS 190A may receive metrics regarding one or more columns (or one or more tables) of a database server 160A. In some embodiments, the database server may, as noted, be configured as an in-memory, column store database. The CaaS 190A may be provided by a platform as a service (PaaS) provider that also provides the database server 160A and/or the cloud store 180, such that the CaaS, database server, and cloud server can operate on the same virtual private network without requiring cross data center or cross PaaS provider communications. Alternatively, the CaaS 190A may be provided at a first data center of the PaaS while the database server 160A and/or cloud store 180 are hosted at a second data center of the PaaS (so cross data center communications is required across the two data centers of the PaaS). Alternatively, the CaaS 190A may be provided at a first PaaS and the database server 160A may be provided at a second, different PaaS provider (so cross PaaS communications is required across the two PaaS providers).

At 410, the metrics may include information related to the columns (or tables) of the database server 160A to enable the CaaS to make a decision on which columns (or tables) are candidates for compression. The metrics may include one or more of the following for each of the tables (or columns) of the database server 160A: size of the tables (or columns) in bytes, access frequency of the table (or columns), an access frequency threshold, a size threshold, and the like.

In response to receiving the metric information, the CaaS 190A may process, at 420, the metric information to identify at least one column (or at least one table) that is a candidate for compression by the CaaS 190A. In some embodiments, the processing may be based on a size threshold and/or an access frequency threshold. For example, the size threshold may be used to identify columns (or tables) that exceed the size threshold and, as such, justify the processing resources to compress the column (or table). While the access frequency threshold may identify table (or columns) that are rarely accessed and thus not be worthy of compression when compared to other tables/columns accessed more frequently.

At 430, the CaaS 190A may compress using a hardware accelerator the at least one column (or table) identified at 420. As noted, the CaaS 190A may include a hardware accelerator, such as an FPGA, to compress the at least one table (or the at least one column) identified at 420.

At 440, the CaaS may notify the DB server that the at least one column (or table) has been compressed. The CaaS may provide a list of the compressed columns (or tables) and/or provide the compressed column(s) (or table(s)) to the database server 160A and/or the cloud store 180 to enable use or reloading of the compressed column or table.

Figure 5:
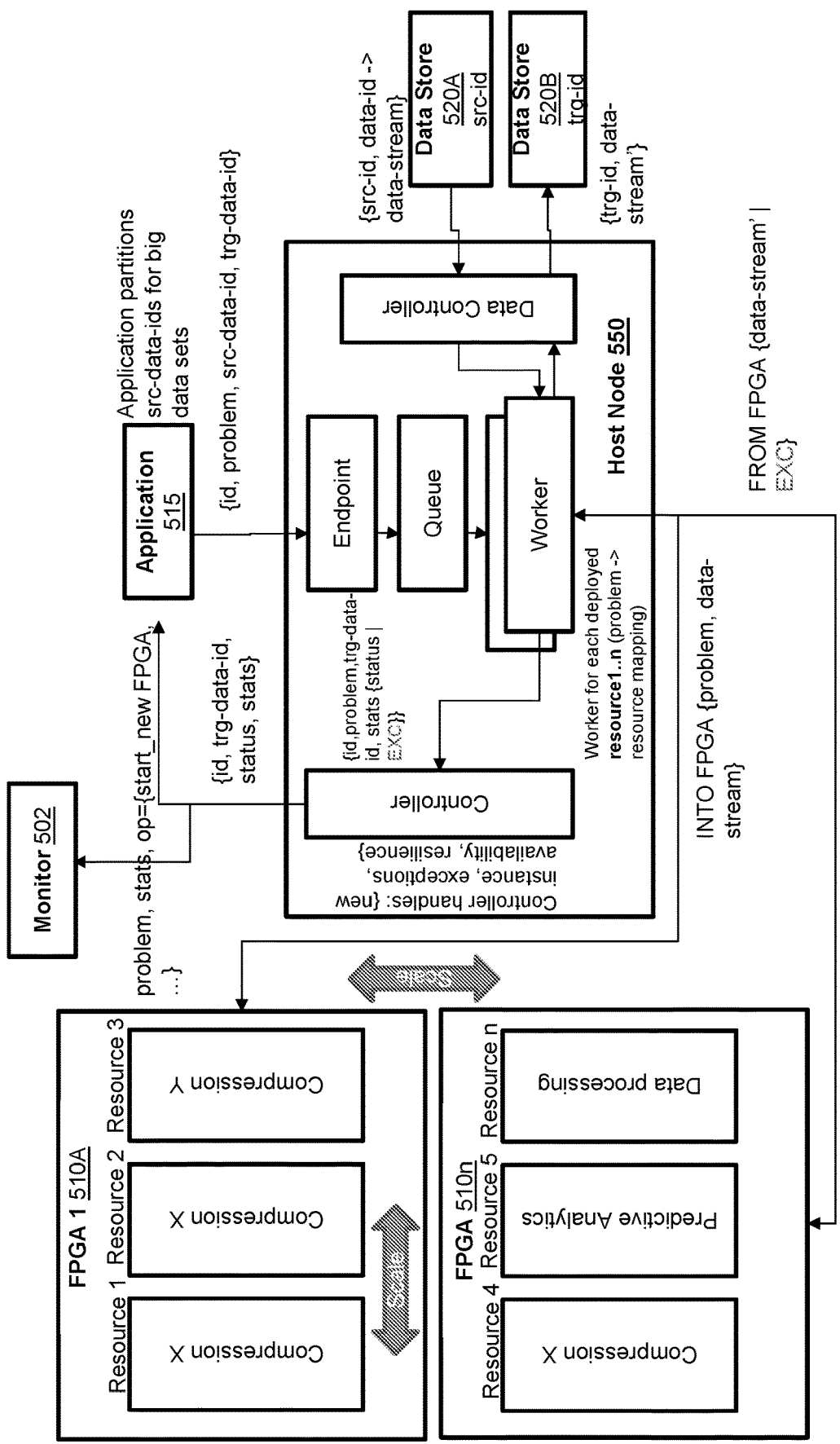
FIG. 5 depicts an example of an implementation of a hardware-based compression as a service (CaaS) using a hardware accelerator such as field programmable gate array circuitry, in accordance with some embodiments.

FIG. 5 depicts an example of an implementation from the perspective of the hardware-based cloud service, which supports CaaS 190A. In FIG. 5, the CaaS 190A is implemented at a host node 550 of a PaaS. The host node handles (or controls) attached FPGAs 510A-N that are scaled in (e.g., added) or scaled out (e.g., deleted) based on the workload monitoring provided by monitoring component 502 that is outside the hardware service. The hardware services may handle synchronous requests that include, for example, a unique id, a problem (that maps to a hardware function, e.g., compression), the data (e.g., for sync requests)/src-data-id and trg-data-id (for streaming big data sets), and return the processed data (e.g., compressed in case of CaaS). Depending on a trigger (e.g., monitoring component) or by itself, an application might require a hardware function to be executed on potentially large amounts of data. The data might either come with the request or streamed from an external data store 520A, which are received via a data controller. For the hardware service's perspective, the requests are buffered (e.g., in a queue) to employ flow control (e.g., back-pressure) in case of busy hardware resources 510A-N. The resources on the hardware are partitioned, while each partition contains the logic of a data processing function (e.g., compression, predictive analytics, or just data processing as custom function). On the host part, each resource partition may be addressed by a worker, which takes new requests depending on its hardware function and/or implemented problem (e.g., compression) and streams the data from the data controller into its attached hardware resource for execution. The result is streamed back into the worker and forwarded into a destination data store 520B. When the result has been forwarded, the worker reports the status of the processing (e.g., id, trg-id, status=SUCCESS, stats/metrics like running times etc.) asynchronously to a local controller and will take a new compression request. The controller reports the status to the monitor 502 or the application 515 decoupled through a publish-subscribe channel on which controller and application can listen to with suing the id.

Figure 6:
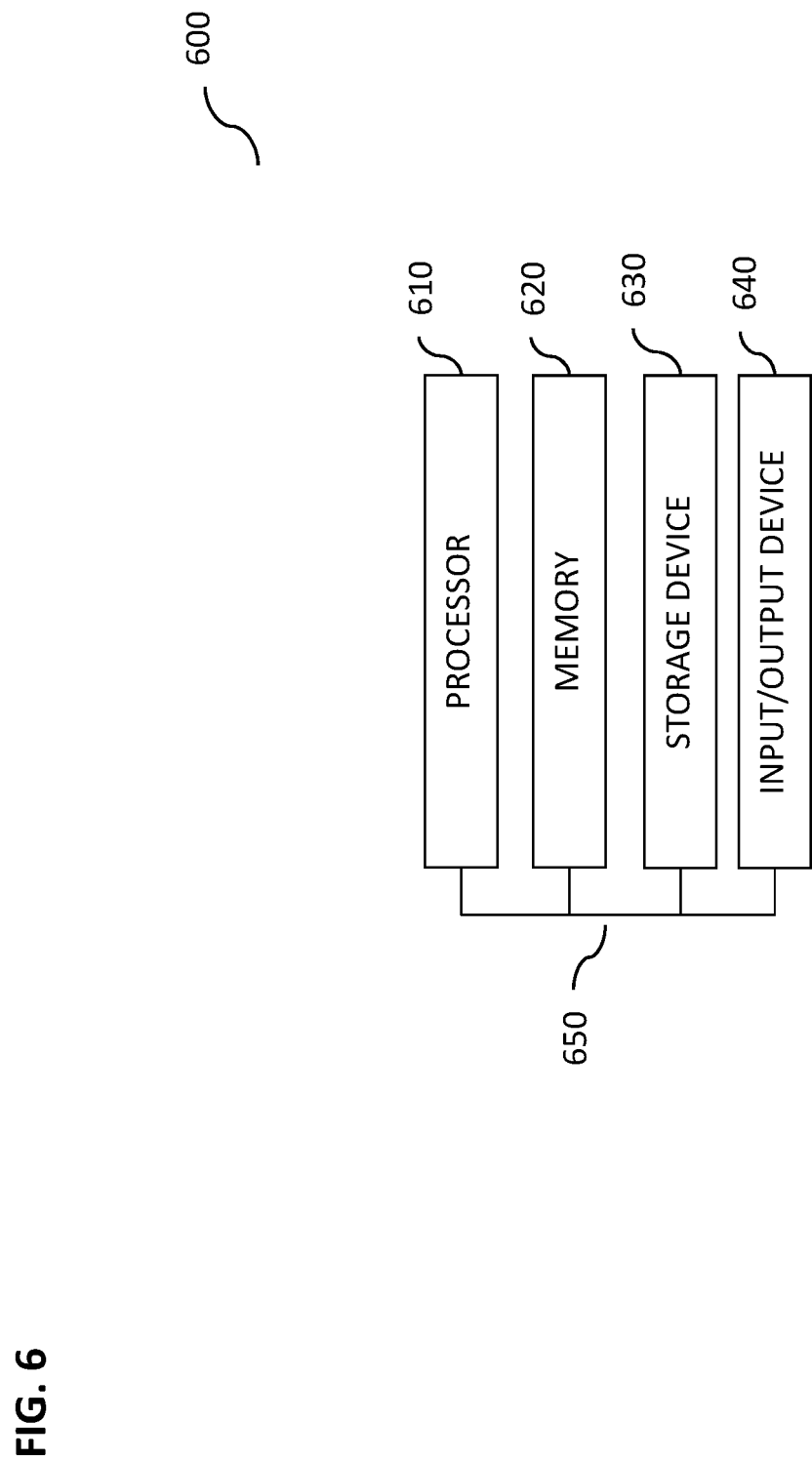
FIG. 6 depicts another example of a system, in accordance with some embodiments.

In some implementations, the current subject matter may be configured to be implemented in a system 600, as shown in FIG. 6. For example, the DB server 160A may be physically implanted on system 600. To illustrate further system 600 may further an operating system, a hypervisor, and/or other resources, to provide virtualize physical resources (e.g., via virtual machines). The system 600 may include a processor 610, a memory 620, a storage device 630, and an input/output device 640. Each of the components 610, 620, 630 and 640 may be interconnected using a system bus 650. The processor 610 may be configured to process instructions for execution within the system 600. In some implementations, the processor 610 may be a single-threaded processor. In alternate implementations, the processor 610 may be a multi-threaded processor. In some embodiments, the system may be coupled to a hardware accelerator, such as an FPGA, executing a compression algorithm such as Re-Pair to compress certain tables (or columns).

The processor 610 may be further configured to process instructions stored in the memory 620 or on the storage device 630, including receiving or sending information through the input/output device 640. The memory 620 may store information within the system 600. In some implementations, the memory 620 may be a computer-readable medium. In alternate implementations, the memory 620 may be a volatile memory unit. In yet some implementations, the memory 620 may be a non-volatile memory unit. The storage device 630 may be capable of providing mass storage for the system 600. In some implementations, the storage device 630 may be a computer-readable medium. In alternate implementations, the storage device 630 may be a floppy disk device, a hard disk device, an optical disk device, a tape device, non-volatile solid state memory, or any other type of storage device. The input/output device 640 may be configured to provide input/output operations for the system 600. In some implementations, the input/output device 640 may include a keyboard and/or pointing device. In alternate implementations, the input/output device 640 may include a display unit for displaying graphical user interfaces.

The systems and methods disclosed herein can be embodied in various forms including, for example, a data processor, such as a computer that also includes a database, digital electronic circuitry, firmware, software, or in combinations of them. Moreover, the above-noted features and other aspects and principles of the present disclosed implementations can be implemented in various environments. Such environments and related applications can be specially constructed for performing the various processes and operations according to the disclosed implementations or they can include a general-purpose computer or computing platform selectively activated or reconfigured by code to provide the necessary functionality. The processes disclosed herein are not inherently related to any particular computer, network, architecture, environment, or other apparatus, and can be implemented by a suitable combination of hardware, software, and/or firmware. For example, various general-purpose machines can be used with programs written in accordance with teachings of the disclosed implementations, or it can be more convenient to construct a specialized apparatus or system to perform the required methods and techniques.

Although ordinal numbers such as first, second and the like can, in some situations, relate to an order; as used in this document ordinal numbers do not necessarily imply an order. For example, ordinal numbers can be merely used to distinguish one item from another. For example, to distinguish a first event from a second event, but need not imply any chronological ordering or a fixed reference system (such that a first event in one paragraph of the description can be different from a first event in another paragraph of the description).

The foregoing description is intended to illustrate but not to limit the scope of the invention, which is defined by the scope of the appended claims. Other implementations are within the scope of the following claims.

These computer programs, which can also be referred to programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, the subject matter described herein can be implemented on a computer having a display device, such as for example a cathode ray tube (CRT) or a liquid crystal display (LCD) monitor for displaying information to the user and a keyboard and a pointing device, such as for example a mouse or a trackball, by which the user can provide input to the computer. Other kinds of devices can be used to provide for interaction with a user as well. For example, feedback provided to the user can be any form of sensory feedback, such as for example visual feedback, auditory feedback, or tactile feedback; and input from the user can be received in any form, including, but not limited to, acoustic, speech, or tactile input.

The subject matter described herein can be implemented in a computing system that includes a back-end component, such as for example one or more data servers, or that includes a middleware component, such as for example one or more application servers, or that includes a front-end component, such as for example one or more client computers having a graphical user interface or a Web browser through which a user can interact with an implementation of the subject matter described herein, or any combination of such back-end, middleware, or front-end components. The components of the system can be interconnected by any form or medium of digital data communication, such as for example a communication network. Examples of communication networks include, but are not limited to, a local area network ("LAN"), a wide area network ("WAN"), and the Internet.

The computing system can include clients and servers. A client and server are generally, but not exclusively, remote from each other and typically interact through a communication network. The relationship of client and server arises by virtue of computer programs running on the respective computers and having a client-server relationship to each other.

In view of the above-described implementations of subject matter this application discloses the following list of examples, wherein one feature of an example in isolation or more than one feature of said example taken in combination and, optionally, in combination with one or more features of one or more further examples are further examples also falling within the disclosure of this application:

Example 1: A computer-implemented method, comprising: receiving, at a compression service, metric information regarding one or more columns of a database server; in response to receiving the metric information, processing, by the compression service, the metric information to identify at least one column as a candidate for compression by the compression service; in response to identifying the at least one column, compressing by the compression service, the at least one column, wherein the compression service uses a hardware accelerator to execution a compression algorithm that compresses the at least one column; and notifying, by the compression service, the database server of the at least one column compressed by the compression service.

Example 2: The computer-implemented method of Example 1, wherein the compression service comprises a hardware data processor providing hardware acceleration for the compressing provided by the compression service.

Example 3: The computer-implemented method of any of Examples 1 to 2, wherein the hardware data processor comprises one or more of the following: at least one field programmable gate array (FPGA), at least one graphics processing unit, and at least one tensor processing unit.

Example 4: The computer-implemented method of any of Examples 1 to 3, wherein the compression service comprises a compression as a service provided by a platform as a service provider.

Example 5: The computer-implemented method of any of Examples 1 to 4, wherein the platform as the service provider that provides the compression service is the same platform as the service provider that provides the database server.

Example 6: The computer-implemented method of any of Examples 1 to 5, wherein the same datacenter of the platform as the service provider provides the compression service and the database server.

Example 7: The computer-implemented method of any of Examples 1 to 6, wherein the different datacenters of the platform as the service provider provide the compression service and the database server.

Example 8: The computer-implemented method of any of Examples 1 to 7, wherein the platform as the service provider that provides the compression service is a different platform as the service provider that provides the database server.

Example 9: The computer-implemented method of any of Examples 1 to 8, wherein the database server comprises an in-memory, column store database.

Example 10: The computer-implemented method of any of Examples 1 to 9, wherein the metric information includes one or more of the following: a size of the at least one column in bytes, an access frequency of the size of the at least one column, an access frequency threshold, and a size threshold.

Example 11: The computer-implemented method of any of Examples 1 to 10, wherein the processing further includes identifying the at least one column in response to a size of the at least one column exceeding a size threshold.

Example 12: The computer-implemented method of any of Examples 1 to 11, wherein the processing further comprises processing at least one other column, and in response to a corresponding size of the at least one other column being less than the size threshold, the at least one other column is not identified for compression by the compression service.

Example 13: The computer-implemented method of any of Examples 1 to 12, wherein the hardware accelerator comprises a floating point gate array providing a recursive pairing compression algorithm.

Example 14: The computer-implemented method of any of Examples 1 to 14, wherein the notifying further comprises the compression service providing a list of the compressed at least one table and/or providing the compressed at least one column.

Example 15: A system comprising: at least one processor; and at least one memory including program code which when executed by at least one processor causes operations comprising: receiving, at a compression service, metric information regarding one or more columns of a database server; in response to receiving the metric information, processing, by the compression service, the metric information to identify at least one column as a candidate for compression by the compression service; in response to identifying the at least one column, compressing by the compression service, the at least one column, wherein the compression service uses a hardware accelerator to execution a compression algorithm that compresses the at least one column; and notifying, by the compression service, the database server of the at least one column compressed by the compression service.

Example 16: The system of Example 15, wherein the compression service comprises a hardware data processor providing hardware acceleration for the compressing provided by the compression service.

Example 17: The system of any of Examples 16 to 16, wherein the hardware data processor comprises one or more of the following: at least one field programmable gate array (FPGA), at least one graphics processing unit, and at least one tensor processing unit.

Example 18: The system of any of Examples 16 to 18, wherein the compression service comprises a compression as a service provided by a platform as a service provider.

Example 19: The system of any of Examples 16 to 19, wherein the database server comprises an in-memory, column store database.

Example 20: A non-transitory computer-readable storage medium including program code which when executed by at least one processor causes operations comprising: receiving, at a compression service, metric information regarding one or more columns of a database server; in response to receiving the metric information, processing, by the compression service, the metric information to identify at least one column as a candidate for compression by the compression service; in response to identifying the at least one column, compressing by the compression service, the at least one column, wherein the compression service uses a hardware accelerator to execution a compression algorithm that compresses the at least one column; and notifying, by the compression service, the database server of the at least one column compressed by the compression service.

The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and sub-combinations of the disclosed features and/or combinations and sub-combinations of several further features disclosed above. In addition, the logic flows depicted in the accompanying figures and/or described herein do not necessarily require the particular order shown, or sequential order, to achieve desirable results. Other implementations can be within the scope of the following claims.

What is claimed is:

1. A computer-implemented method, comprising:
receiving, at a compression service, metric information regarding one or more columns of a database server, wherein the compression service comprises a compression as a service provided by a platform as a service provider, wherein the compression as a service is scaled up as a demand for compression increases, and wherein the compression as a service is scaled down as the demand for compression decreases;

interfacing, by a compression as a service orchestrator, with the compression as a service;

in response to receiving the metric information, processing, by the compression as a service, the metric information to trigger, by the compression as a service orchestrator, the compression as a service to identify at least one column as a candidate for compression by the compression as a service, wherein the at least one column is identified in response to a size of the at least one column exceeding a size threshold;

determining, by the compression as a service orchestrator, a compression scheme for the compression as a service to compress the at least one column;

selecting, by the compression as a service orchestrator, a data processor of the compression as a service to compress the at least one column and scheduling work on the selected data processor;

in response to identifying the at least one column, compressing by the compression as a service, the at least one column, wherein the compression as a service uses a hardware accelerator to execute a first compression algorithm that compresses the at least one column according to the compression scheme;

consuming, by the compression as a service orchestrator, results of the compression as a service compressing the at least one column to assess a quality of the compression of the at least one column; and notifying, by the compression as a service, the database server of the at least one column compressed by the compression as a service.

2. The computer-implemented method of claim 1, wherein the compression as a service comprises a hardware data processor providing hardware acceleration for the compression scheme provided by the compression as a service.

3. The computer-implemented method of claim 2, wherein the hardware data processor comprises one or more of the following: at least one field programmable gate array (FPGA), at least one graphics processing unit, and at least one tensor processing unit.

4. The computer-implemented method of claim 1, wherein the platform as the service provider that provides the compression as a service is a different platform from the service provider that provides the database server.

5. The computer-implemented method of claim 1, further comprising processing, by the compression as a service, the metric information to determine the size threshold.

6. The computer-implemented method of claim 1, wherein the metric information includes all of the following: a size of the at least one column in bytes, an access frequency of the size of the at least one column, an access frequency threshold, and the size threshold.

7. The computer-implemented method of claim 1, wherein the at least one column comprises data representative of an index.

8. The computer-implemented method of claim 1, further comprising compressing, by the compression as a service, at least one other column with a second compression algorithm in response to a corresponding size of the at least one other column being less than the size threshold.

9. The computer-implemented method of claim 1, further comprising identifying the at least one column as the candidate for compression by the compression as a service in response to an access frequency of the at least one column exceeding an access frequency threshold and in response to the size of the at least one column exceeding the size threshold.

10. The computer-implemented method of claim 1, further comprising identifying the at least one column as the candidate for compression by the compression as a service in response to the at least one column containing a string of values exceeding a string length threshold.

11. A system comprising:

at least one processor; and at least one memory including program code which when executed by at least one processor causes operations comprising:

receiving, at a compression service, metric information regarding one or more columns of a database server, wherein the compression service comprises a compression as a service provided by a platform as a service provider, wherein the compression as a service is scaled up as a demand for compression increases, and wherein the compression as a service is scaled down as the demand for compression decreases;

interfacing, by a compression as a service orchestrator, with the compression as a service;

in response to receiving the metric information, processing, by the compression as a service, the metric information to trigger, by the compression as a service orchestrator, the compression as a service to identify at least one column as a candidate for compression by the compression as a service, wherein the at least one column is identified in response to a size of the at least one column exceeding a size threshold;

determining, by the compression as a service orchestrator, a compression scheme for the compression as a service to compress the at least one column;

selecting, by the compression as a service orchestrator, a data processor of the compression as a service to compress the at least one column and scheduling work on the selected data processor;

in response to identifying the at least one column, compressing by the compression as a service, the at least one column, wherein the compression as a service uses a hardware accelerator to execute a compression algorithm that compresses the at least one column according to the compression scheme;

consuming, by the compression as a service orchestrator, results of the compression as a service compressing the at least one column to assess a quality of the compression of the at least one column; and notifying, by the compression as a service, the database server of the at least one column compressed by the compression as a service.

12. The system of claim 11, wherein the compression as a service comprises a hardware data processor providing hardware acceleration for the compression scheme provided by the compression as a service.

13. The system of claim 12, wherein the hardware data processor comprises one or more of the following: at least one field programmable gate array (FPGA), at least one graphics processing unit, and at least one tensor processing unit.

14. The system of claim 11, wherein the database server comprises an in-memory, column store database.

15. A non-transitory computer-readable storage medium including program code which when executed by at least one processor causes operations comprising:

receiving, at a compression service, metric information regarding one or more columns of a database server, wherein the compression service comprises a compression as a service provided by a platform as a service provider, wherein the compression as a service is scaled up as a demand for compression increases, and wherein the compression as a service is scaled down as the demand for compression decreases;

interfacing, by a compression as a service orchestrator, with the compression as a service;

in response to receiving the metric information, processing, by the compression as a service, the metric information to trigger, by the compression as a service orchestrator, the compression as a service to identify at least one column as a candidate for compression by the compression as a service, wherein the at least one column is identified in response to a size of the at least one column exceeding a size threshold;

determining, by the compression as a service orchestrator, a compression scheme for the compression as a service to compress the at least one column;

selecting, by the compression as a service orchestrator, a data processor of the compression as a service to compress the at least one column and scheduling work on the selected data processor;

in response to identifying the at least one column, compressing by the compression as a service, the at least one column, wherein the compression as a service uses a hardware accelerator to execute a compression algorithm that compresses the at least one column according to the compression scheme;

consuming, by the compression as a service orchestrator, results of the compression as a service compressing the at least one column to assess a quality of the compression of the at least one column; and notifying, by the compression as a service, the database server of the at least one column compressed by the compression as a service.

\* \* \* \* \*